United States Patent [19]

Yazawa et al.

[11] 4,367,419
[45] Jan. 4, 1983

[54] ANALOG SWITCH

[75] Inventors: Nobuharu Yazawa; Masao Yoshitomi, both of Itami, Japan

[73] Assignee: Mitsubishi Denki Kabushiki Kaisha, Tokyo, Japan

[21] Appl. No.: 142,161

[22] Filed: Apr. 14, 1980

[30] Foreign Application Priority Data

May 30, 1979 [JP] Japan .................................. 54-69139

[51] Int. Cl.³ ..................... H03K 17/00; H03K 17/60
[52] U.S. Cl. .................................... 307/254; 307/264; 328/99
[58] Field of Search ................... 307/264, 254; 328/99

[56] References Cited

U.S. PATENT DOCUMENTS

| | | | |
|---|---|---|---|
| 2,535,912 | 12/1950 | Frank et al. | 328/99 |
| 2,831,971 | 4/1958 | Wischmeyer | 328/99 |
| 2,914,669 | 11/1959 | Wright et al. | 328/99 |
| 2,943,260 | 6/1960 | Barnard | 328/99 |
| 3,123,721 | 3/1964 | Kaufman | 307/254 |
| 3,199,034 | 8/1965 | Ritter | 307/254 |
| 3,546,485 | 12/1970 | Davis | 328/99 |
| 3,551,703 | 12/1970 | Bischoff | 328/99 |

OTHER PUBLICATIONS

"High Speed JFET Analog Switches . . . " by Givens EDN, Feb. 5, 1974, pp. 76-84.

Primary Examiner—Harold A. Dixon
Attorney, Agent, or Firm—Wenderoth, Lind & Ponack

[57] ABSTRACT

An analog switch having a first feedback amplifier supplied with a signal superposed with a bias voltage and a second feedback amplifier supplied with the bias voltage. Each amplifier has a differential amplifier formed of two symmetrically connected transistors and having an output connected to both a common output terminal and its input through an impedance transforming transistor. The differential amplifier is biased by a constant current source formed of a transistor and a diode. In the presence of a control signal, the first amplifier is closed through the normal operation of its constant current source while the second amplifier is opened by disabling its constant current source. In the absence of the control signal, the first and second amplifiers are opened and closed, respectively.

2 Claims, 5 Drawing Figures

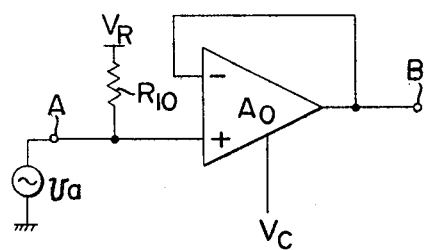
FIG. I
PRIOR ART
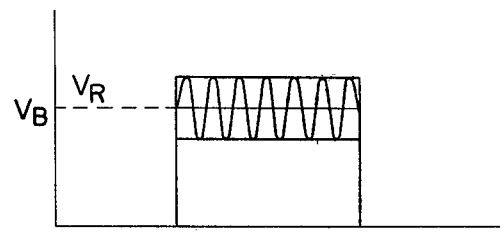
FIG. 2
PRIOR ART
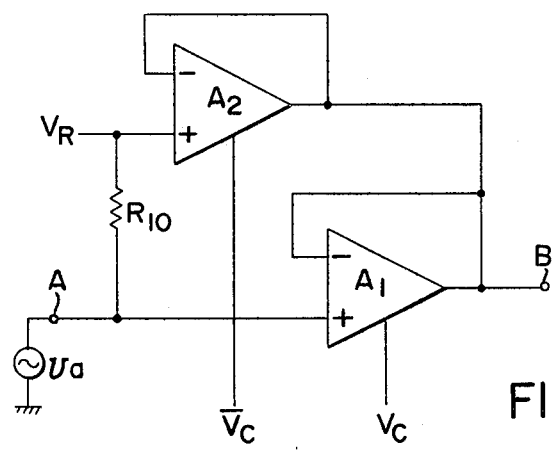
FIG. 3
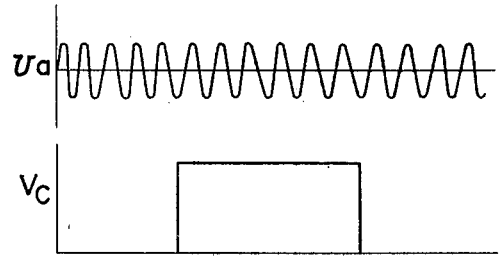
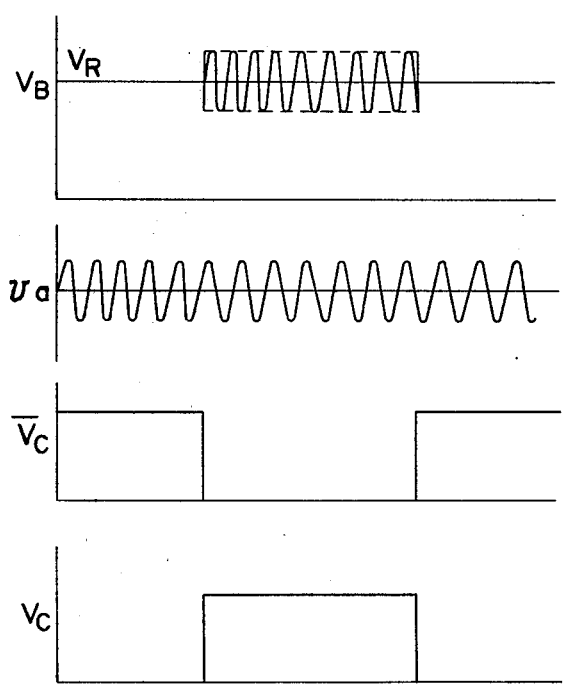
FIG. 4

ANALOG SWITCH

BACKGROUND OF THE INVENTION

This invention relates to an analog switch, and more particularly to an analog switch for switching a signal by opening and closing a bias circuit for an amplifier involved.

Conventional analog switches of the type referred to have comprised a feedback amplifier having a positive input to which a signal to be switched and a bias voltage are applied. During the application of a control signal in form of a rectangular pulse applied thereto, the feedback amplifier has been put in its closed position to deliver the signal superposed on the bias voltage to its output. However, in the absence of the control signal, the feedback amplifier has been in its open position to prevent the signal from being developed at its output. Conventional analog switches as described above have been very excellent in that the input impedance in operation is very high and the distortion factor is very small. However, they may generate transient noise during the switching because of the fact that the operating voltage in its open position is much different from the bias voltage. That transient noise offends the ear particularly in the case of audio equipment which must have low transient.

Accordingly, it is an object of the present invention to provide a new and improved analog switch for switching a signal with a small distortion factor and which is still free from transient noise generated upon switching.

SUMMARY OF THE INVENTION

The present invention provides an analog switch comprising a first amplifier including an input having applied thereto an input signal superposed on a bias voltage and responsive to a first control signal to perform the switching operation, and a second amplifier which has an input having only the bias voltage applied thereto and which is responsive to a second control signal which is opposite in phase to the first control signal to perform the switching operation, the first and second feedback amplifiers having respective outputs connected together.

In a preferred embodiment of the present invention each of the first and second amplifiers is of the feedback type and includes a first and a second transistor forming a differential amplifier, a third transistor for impedance-transforming an output from the differential amplifier and a fourth transistor forming a constant current source for biasing the differential amplifier.

BRIEF DESCRIPTION OF THE DRAWINGS

The present invention will become more readily apparent from the following detailed description taken in conjunction with the accompanying drawings in which:

FIG. 1 is a combined block and circuit diagram of a conventional amplifier type analog switch;

FIG. 2 is a graph illustrating waveforms developed at various points in the arrangement shown in FIG. 2;

FIG. 3 is a combined block and circuit diagram of one embodiment according to the analog switch of the present invention;

FIG. 4 is a graph illustrating waveforms developed at various points in the arrangement shown in FIG. 3.

DESCRIPTION OF THE PREFERRED EMBODIMENT

Figure 5:
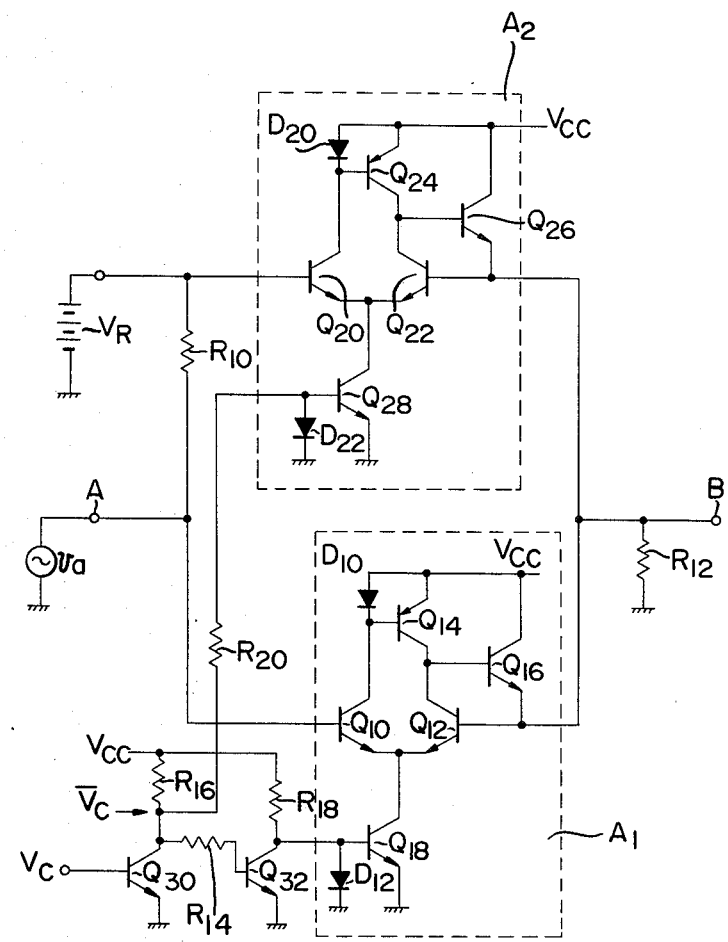
FIG. 5 is a circuit diagram of the details of the arrangement shown in FIG. 3.

Referring now to FIG. 1 of the drawings there is illustrated a conventional amplifier type analog switch. The arrangement illustrated comprises a feedback amplifier $A_o$ having a positive input connected to an input terminal A and, a signal source $v_a$ for supplying a signal also designated by the reference characters $v_a$ to the positive input to the feedback amplifier $A_o$ through the input terminal A. A bias voltage $V_R$ is applied to the positive input to the feedback amplifier $A_o$ through a bias resistor $R_{10}$ to bias that input and control signal $V_C$ is applied to the amplifier $A_o$ to switch the bias thereof. The amplifier $A_o$ has an output connected to an output terminal B.

The control signal $V_C$ is in the form of a rectangular pulse as shown at waveform $V_C$ in FIG. 2. When the control signal $V_C$ is not applied thereto, the feedback amplifier $A_o$ does not perform the amplifying operation and prevents the signal $v_a$ in this case, an analog signal (see waveform $v_a$ shown in FIG. 2) from the signal source $V_a$ from being conducted to the output terminal B. During the application of the control signal $V_C$ thereto, the feedback amplifier $A_o$ is operated to amplify the signal $V_a$ with a gain of unity. Therefore, the signal $V_a$ is superposed on the bias voltage $V_R$ and passed through the amplifier $A_o$ unit and is developed at the output terminal B as an output signal $V_B$ as shown at waveform $V_B$ in FIG. 2. Thus, the amplifier $A_o$ performs the switching operation in response to the control signal $V_C$.

Conventional analog switches such as shown in FIG. 1 have been very advantageous in that in operation the input impedance is very high and the distortion factor is very small because the amplifier is of the negative feedback type. However, in the absence of the control signal $V_C$, the signal $v_a$ has been not only prevented from reaching the output terminal B as described above but also the output voltage at the terminal B has been much different from the bias voltage $V_R$ resulting in a great variation in DC potential of the output. Accordingly, upon turning the amplifier on and off, transient noise might be generated. This transient noise offends the ear particularly for acoustic equipment and such transient noise must be decreased for such equipment.

Referring now to FIG. 3, there is illustrated one embodiment according to the analog switch of the present invention. The arrangement illustrated comprises a pair of first and second feedback amplifiers $A_1$ and $A_2$ respectively. The first feedback amplifier $A_1$ is connected to the signal source $v_a$, the bias voltage $V_R$ and the control signal $V_C$ in the same manner as described above in conjunction with FIG. 1 and the second feedback amplifier $A_2$ has a positive input having the bias voltage $V_R$ directly applied thereto and an output connected to the output terminal B. Thus, the first and second amplifiers $A_1$ and $A_2$ respectively have respective outputs connected together to the output terminal B. Furthermore, the second feedback amplifier $A_2$ has applied thereto another control signal $\overline{V}_C$ also in the form of a rectangular pulse opposite in phase to the control signal $V_C$ as will readily understood from waveform $V_C$ and $\overline{V}_C$ shown in FIG. 4.

The first feedback amplifier $A_1$ is operated in the same manner as the feedback amplifier $A_o$ shown in FIG. 1. Similarly, the second feedback amplifier $A_2$ is put in its closed and open positions in response to the presence and absence of the control signal $\overline{V}_C$ respectively. As seen from waveforms $V_C$ and $\overline{V}_C$ shown in FIG. 4, the amplifier $A_1$ is in its open position while the amplifier $A_2$ is in its closed position and vice versa. Under these circumstances, only the bias voltage $V_R$ is developed at the output terminal B in the closed position of the amplifier $A_2$ and the signal $v_a$ (see also waveform $v_a$ shown in FIG. 4) superposed on the bias voltage $V_R$ is developed at the output terminal B in the closed position of the amplifier $A_1$. Consequently, a potential at the output terminal B does not change in the sense of the direct current as shown at waveform $V_B$ in FIG. 4. Therefore, the switching of one to the other of the first and second amplifiers $A_1$ and $A_2$ respectively does not cause transient noise generation. Upon switching from one to the other of the amplifiers $A_1$ and $A_2$, a slight difference in potential appears in the output signal $V_B$ at the output terminal B due to a voltage drop across the bias resistor $R_{10}$ and the offset between the amplifiers $A_1$ and $A_2$. However, such a difference in potential is small and particularly small for integrated circuits, so that it is not large enough to result in the so-called transient noise.

The arrangement of FIG. 3 is preferably of a circuit configuration as shown in FIG. 5. In the arrangement illustrated, the first feedback amplifier $A_1$ comprises a differential amplifier formed of first and second NPN transistors $Q_{10}$ and $Q_{12}$ interconnected symmetrically with their emitter electrodes connected together, and an active load formed of a PNP transistor $Q_{14}$ including a base and a collector electrode connected to collector electrodes of the transistors $Q_{10}$ and $Q_{12}$ respectively, and a diode $D_{10}$ connected across the base and emitter electrodes of the transistor $Q_{14}$. The emitter electrode of the transistor $Q_{14}$ and therefore the anode electrode of the diode $D_{10}$ is connected to a DC source $V_{CC}$. The differential amplifier $Q_{10}$–$Q_{12}$ forms an amplifier with the active load $Q_{14}$–$D_{10}$. That amplifier is connected at the output or the collector electrode of the transistor $Q_{14}$ to a base electrode of a third NPN transistor $Q_{16}$ having a collector electrode connected to the DC source $V_{CC}$ and an emitter electrode connected to the base electrode of the transistor $Q_{12}$ and also to the output terminal B which is subsequently connected to ground through an output resistor $R_{12}$. The transistor $Q_{16}$ impedance-transforms an output from the last-mentioned amplifier and then delivers it to the output terminal B while feeding back that output to the base electrode of the transistor $Q_{12}$.

The first NPN transistor $Q_{10}$ has its base electrode connected to the signal source $v_a$ through the input terminal A and also to a bias source also designated by the reference character $V_R$ through the bias resistor $R_{10}$.

The differential amplifier $Q_{10}$–$Q_{12}$ is biased by a constant current source formed of a fourth NPN transistor $Q_{18}$ having its collector electrode connected to the interconnected emitter electrodes of the transistors $Q_{10}$ and $Q_{12}$ and having its emitter electrode connected to ground, and another diode $D_{12}$ connected between the base electrode of transistor $Q_{18}$ and ground to be so poled that a current conducts to ground therethrough.

The second feedback amplifier $A_2$ is identical in circuit configuration to the first feedback amplifier $A_1$. Therefore the components of the second feedback amplifier $A_2$ which are identical to those of the first feedback amplifier $A_1$ are designated by like reference characters suffixed with similar reference numerals of the 20 series but not of the 10 series. For example, $Q_{20}$ designates an NPN transistor identical to that identified by $Q_{10}$. However, it is noted that the NPN transistor $Q_{20}$ has its base electrode connected directly to the bias source $V_R$ alone.

As shown in FIG. 5, the control signal $V_C$ is applied to a base electrode of a fifth NPN transistor $Q_{30}$ of the common emitter configuration and having its collector electrode connected via a resistor $R_{14}$ to a sixth NPN transistor $Q_{32}$ of the common emitter configuration, having its collector electrode connected to the base electrode of the fourth NPN transistor $Q_{18}$. The collector electrodes of the transistors $Q_{30}$ and $Q_{32}$ are also connected to the DC source $V_{CC}$ through respective resistors $R_{16}$ and $R_{18}$. Furthermore, the collector electrode of the fifth NPN transistor $Q_{30}$ is connected via a resistor $R_{20}$ to the base electrode of the fourth NPN transistor $Q_{28}$ disposed in the second feedback amplifier $A_2$.

In FIG. 5, the control voltage $\overline{V}_C$ is shown at the arrow as being applied to the junction of the collector electrode of the transistor $Q_{30}$ and the resistor $R_{16}$ and therefore to the second feedback amplifier $A_2$.

In operation, the control voltage $V_C$, having a high value of the waveform $V_C$ shown in FIG. 4, causes the transistor $Q_{30}$ to be turned on so as to thereby turn the transistor $Q_{28}$, disposed in the second amplifier $A_2$, off. This turn off of the transistor $Q_{28}$ causes the bias current through the second feedback amplifier $A_2$ to be zero so as to place the amplifier $A_2$ in its open position, wherein the amplifying operation is not performed. This means that the control voltage $V_C$, having a high value, is not applied to the second feedback amplifier $A_2$. As a result, the bias voltage $V_R$ is not developed at the output terminal B.

On the other hand, when the control voltage $V_C$, having a low magnitude or the absence of the waveform $V_C$ shown in FIG. 4, causes the transistor $Q_{30}$ to be turned off so as to maintain the transistor $Q_{28}$ at the normal bias voltage to thereby place the second feedback amplifier $A_2$ in its closed position. This is equivalent to the application of the control voltage $\overline{V}_C$ to the second feedback amplifier $A_2$. As a result, the bias voltage $V_R$ is developed at the output terminal B.

The NPN transistor $Q_{32}$ performs the operation of an inverter so that the control voltage $V_C$ is inverted. Therefore, the first feedback amplifier $A_1$ is in the mode of operation reversed from that of the second feedback amplifier $A_2$. That is, the control voltage $V_C$ having the high value causes the first amplifier $A_1$ to be put in its closed position but the same having the low value results in the open position thereof. In the closed position, the first amplifier permits the signal $V_a$ superposed on the bias voltage $V_R$ to pass therethrough to thereby be supplied to the output terminal B.

From the foregoing it is seen that the present invention provides an analog switch which is free from transient noise and has a small distortion factor. When applied to integrated circuits, the present invention provides analog switches which is small in its offset and good in performance because the balance among respective switches as well as that between the transistors $Q_{10}$ and $Q_{12}$ and between the transistors $Q_{20}$ and $Q_{22}$ is well maintained. Also, another effective application of the present invention is found in muting circuits in which only the signal voltage is blanked by applying the control voltage $V_C$ without the bias voltage being changed. The resulting circuits are similarly free from transient noise and are high in performance.

While the present invention has been illustrated and described in conjunction with a single preferred embodiment thereof, it is to be understood that numerous changes and modifications may be resorted to without departing from the spirit and scope of the present invention. For example, the present invention has been described in terms of an analog signal, but it is to be understood that the same is equally applicable to a wide variety of types of signals.

What we claim is:

1. An analog switch having first and second amplifiers, each of said amplifiers comprising:
   a pair of transistors connected in a common emitter differential amplifier configuration;
   an active load for said differential amplifier, said active load formed of a diode and a transistor connected to the collectors of said differential transistor pair;
   an impedance matching transistor connected to said differential transistor pair for impedance matching an output of said differential pair;
   a current source comprising a diode and a transistor operatively connected to the common emitters of said differential transistor pair, the base of said current source transistor serving as a control input of its respective amplifier to control the operation thereof;
   said analog switch further including an inverter amplifier connected to said control input of one of said first and second amplifiers and having a control input signal applied thereto, said control input signal also applied to the control input of the other of said first and second amplifier control inputs;
   wherein one of said first and second amplifiers has a signal consisting of a combination of an input signal superimposed on a bias voltage applied to an input of its respective differential amplifier and said other of said first and second amplifiers having an input of its respective differential amplifier connected only to said bias voltage;
   an output from each of said impedance transforming transistors are connectedtogether to form a combined output, wherein said control signal enables one of said first and second amplifiers to be operative when said other of said first and second amplifiers is inoperative and enables said other of said first and second amplifiers to be operative when said one of said first and second amplifiers is inoperative.

2. An analog switch comprising a first amplifier having an input having a signal consisting of the combination of an input signal superimposed on a bias voltage supplied thereto and responsive to a first control signal to perform a switching operation, and a second amplifier having an input consisting only of said bias voltage supplied thereto and responsive to a second control signal which is opposite in phase from said first control signal to perform a switching operation, said first and second amplifiers having respective outputs connected together wherein said first control signal enables said first amplifier to be operative when said second amplifier is inoperative and said second control signal enables said second amplifier to be operative when said first amplifier is inoperative;
   wherein said first and second amplifiers are of the feedback type;
   and wherein each of said feedback type amplifiers comprises a first and a second transistor forming a differential amplifier, a third transistor for impedance-transforming an output from said differential amplifier, and a fourth transistor forming a constant current source for biasing said differential amplifier; and,
   wherein said first and second control signals are respectively supplied to said fourth transistor of said first and second amplifiers at its respective base.

* * * * *